(12) United States Patent
Kuranaga et al.

(10) Patent No.: US 9,135,858 B2
(45) Date of Patent: Sep. 15, 2015

(54) IMAGE DISPLAY DEVICE

(75) Inventors: Takahide Kuranaga, Tachikawa (JP); Tohru Kohno, Koganei (JP); Hajime Akimoto, Kokubunji (JP); Hiroshi Kageyama, Hachioji (JP)

(73) Assignees: JAPAN DISPLAY INC., Tokyo (JP); CANON KABUSHIKI KAISHA, Tokyo (JP)

( * ) Notice: Subject to any disclaimer, the term of this patent is extended or adjusted under 35 U.S.C. 154(b) by 1209 days.

(21) Appl. No.: 12/699,106

(22) Filed: Feb. 3, 2010

(65) Prior Publication Data
US 2010/0201675 A1    Aug. 12, 2010

(30) Foreign Application Priority Data

Feb. 6, 2009    (JP) .................................. 2009-025833

(51) Int. Cl.
G06F 3/038    (2013.01)
G09G 3/32    (2006.01)
H01L 27/32    (2006.01)

(52) U.S. Cl.
CPC ........ *G09G 3/325* (2013.01); *G09G 2300/0852* (2013.01); *G09G 2300/0861* (2013.01); *G09G 2320/045* (2013.01); *G09G 2330/045* (2013.01); *H01L 27/3244* (2013.01)

(58) Field of Classification Search
CPC .. G06F 3/038; G09G 3/325; G09G 2330/045; G09G 2300/0861; G09G 2320/045; G09G 2300/0852; G09G 2330/021; G09G 2330/02; G09G 3/3696; H01L 27/3244
USPC .................................. 345/211, 1.1
See application file for complete search history.

(56) References Cited

U.S. PATENT DOCUMENTS

| 5,990,860 | A | * | 11/1999 | Takeuchi | ...................... 345/667 |
| 7,982,697 | B2 | * | 7/2011 | Kasai et al. | ...................... 345/77 |
| 2003/0067424 | A1 | | 4/2003 | Akimoto et al. | |
| 2003/0090603 | A1 | * | 5/2003 | Chae et al. | ...................... 349/43 |
| 2008/0192013 | A1 | * | 8/2008 | Barrus et al. | ................... 345/173 |
| 2009/0027374 | A1 | * | 1/2009 | Kohno et al. | ................. 345/212 |
| 2009/0284502 | A1 | * | 11/2009 | Hayafuji | ...................... 345/205 |

FOREIGN PATENT DOCUMENTS

JP    2003-122301    4/2003

OTHER PUBLICATIONS

R. M. A. Dawson et al.; Design of an improved Pixel for a Polysilicon Active-Matrix Organic LED Display; Society for Information Display symposium Digest of Technical Papers, May 1998; pp. 11-14; vol. 29, Issue 1.

* cited by examiner

Primary Examiner — Towfiq Elahi
(74) Attorney, Agent, or Firm — Lowe Hauptman & Ham, LLP

(57) ABSTRACT

Provided is an image display device, which includes: a display area including a plurality of pixels each of which includes a self light-emitting element; and a plurality of signal lines for inputting an image voltage to each of the plurality of pixels, in which: each of the plurality of pixels includes a field-effect transistor for driving the self light-emitting element based on the image voltage which is input through each of the plurality of signal lines to each of the plurality of pixels; the display area is divided into at least two regions including a first region and a second region; and a (channel width-to-channel length) ratio of the field-effect transistor in the first region is smaller than the ratio of any field-effect transistor in the second region.

6 Claims, 16 Drawing Sheets

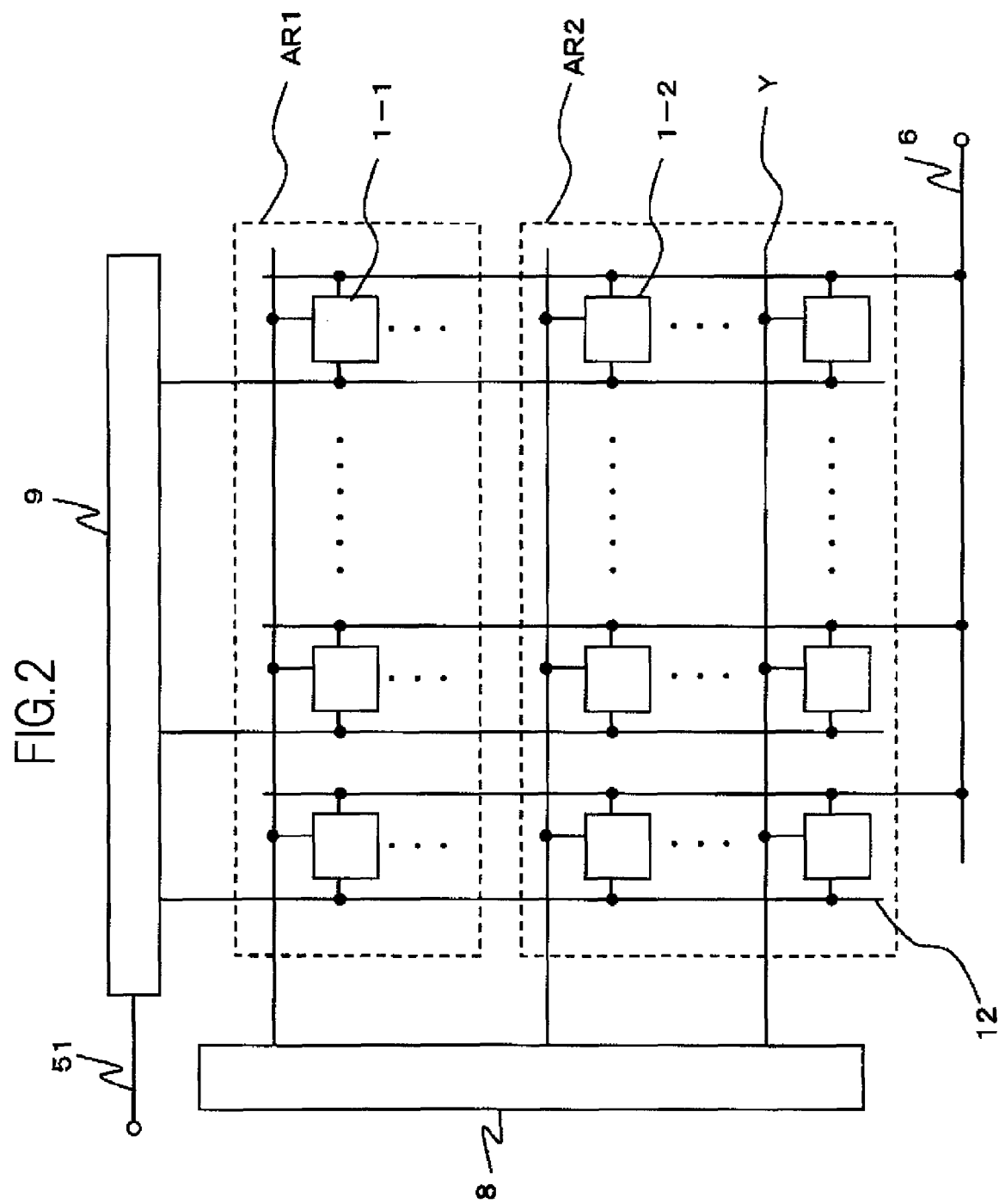

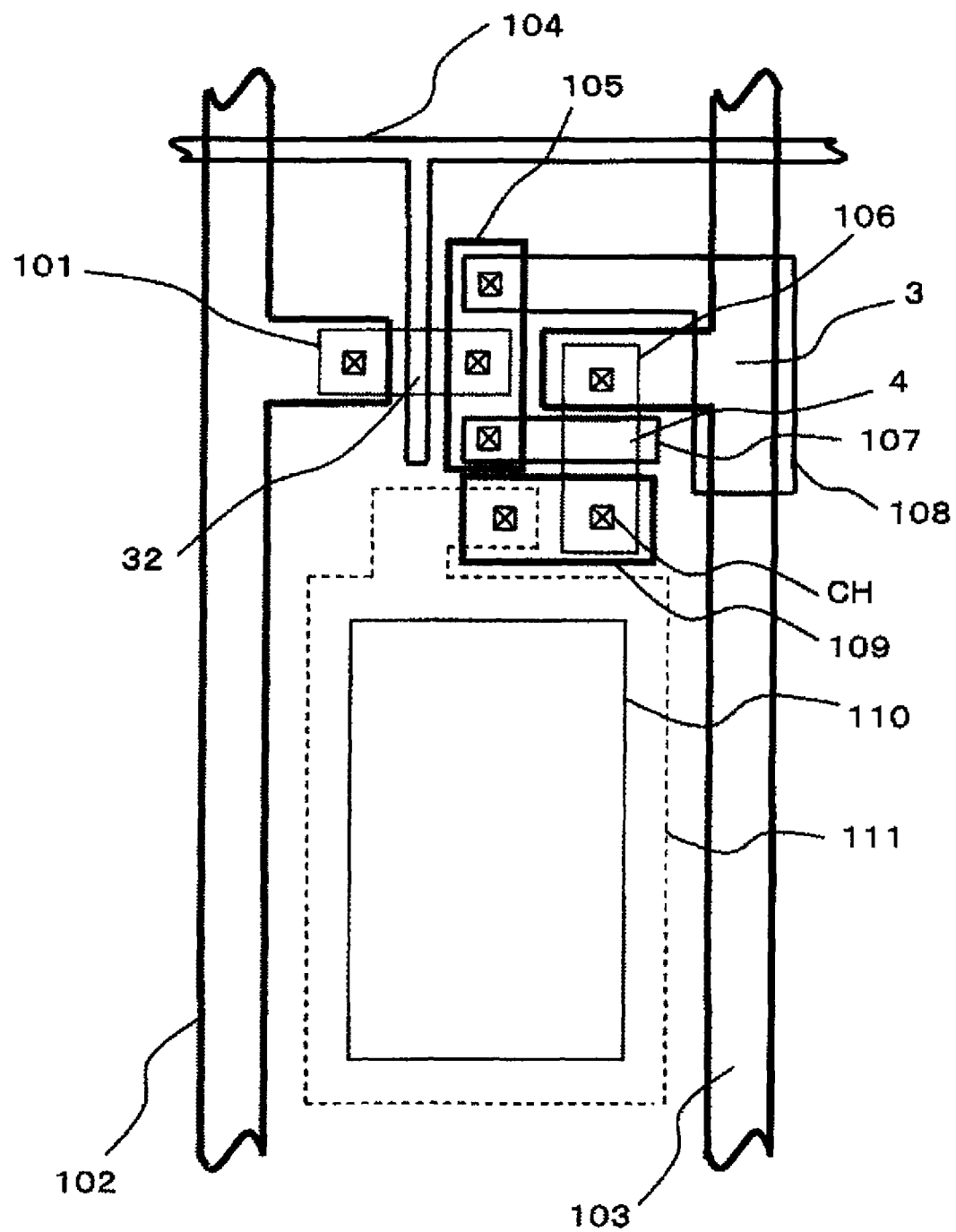

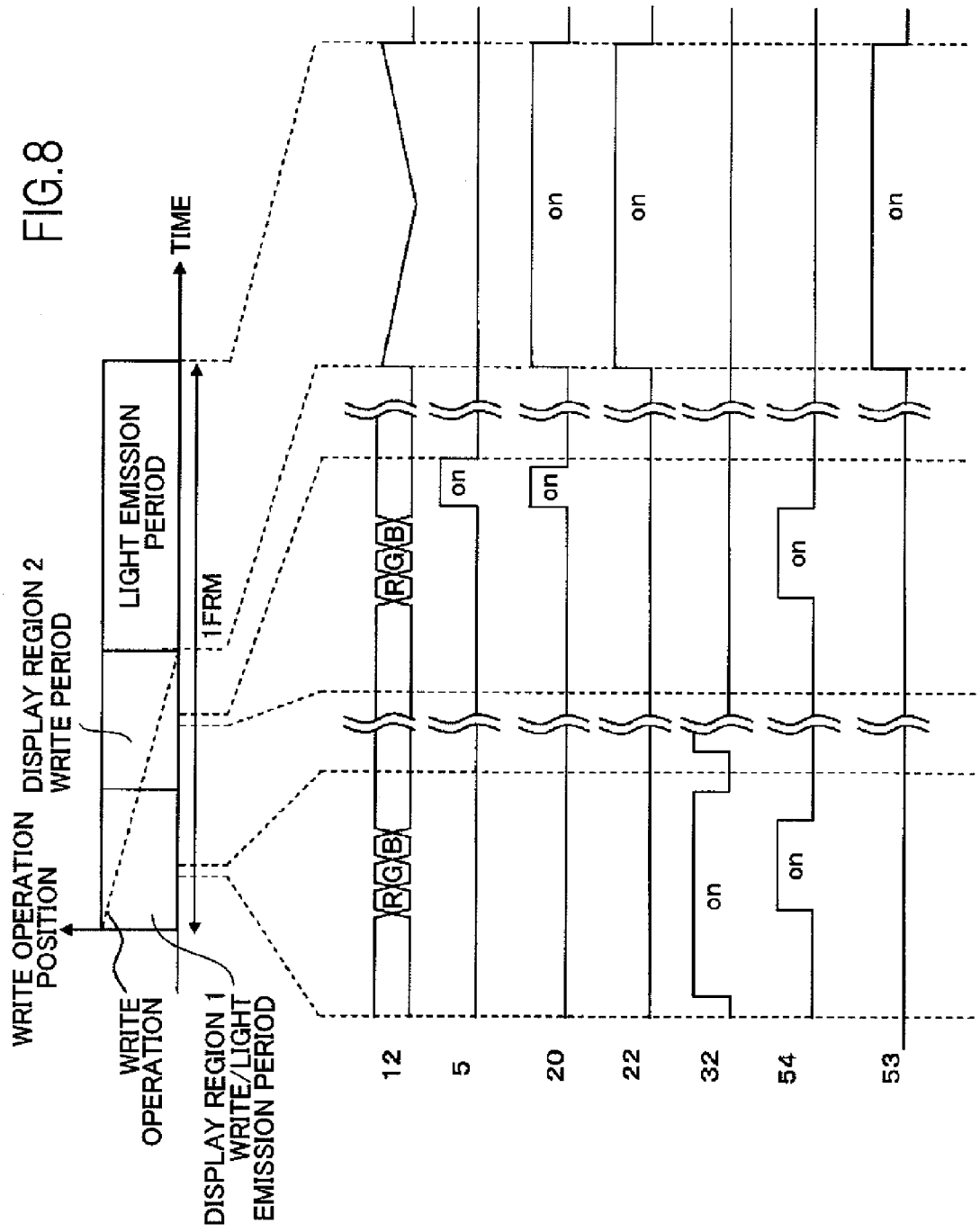

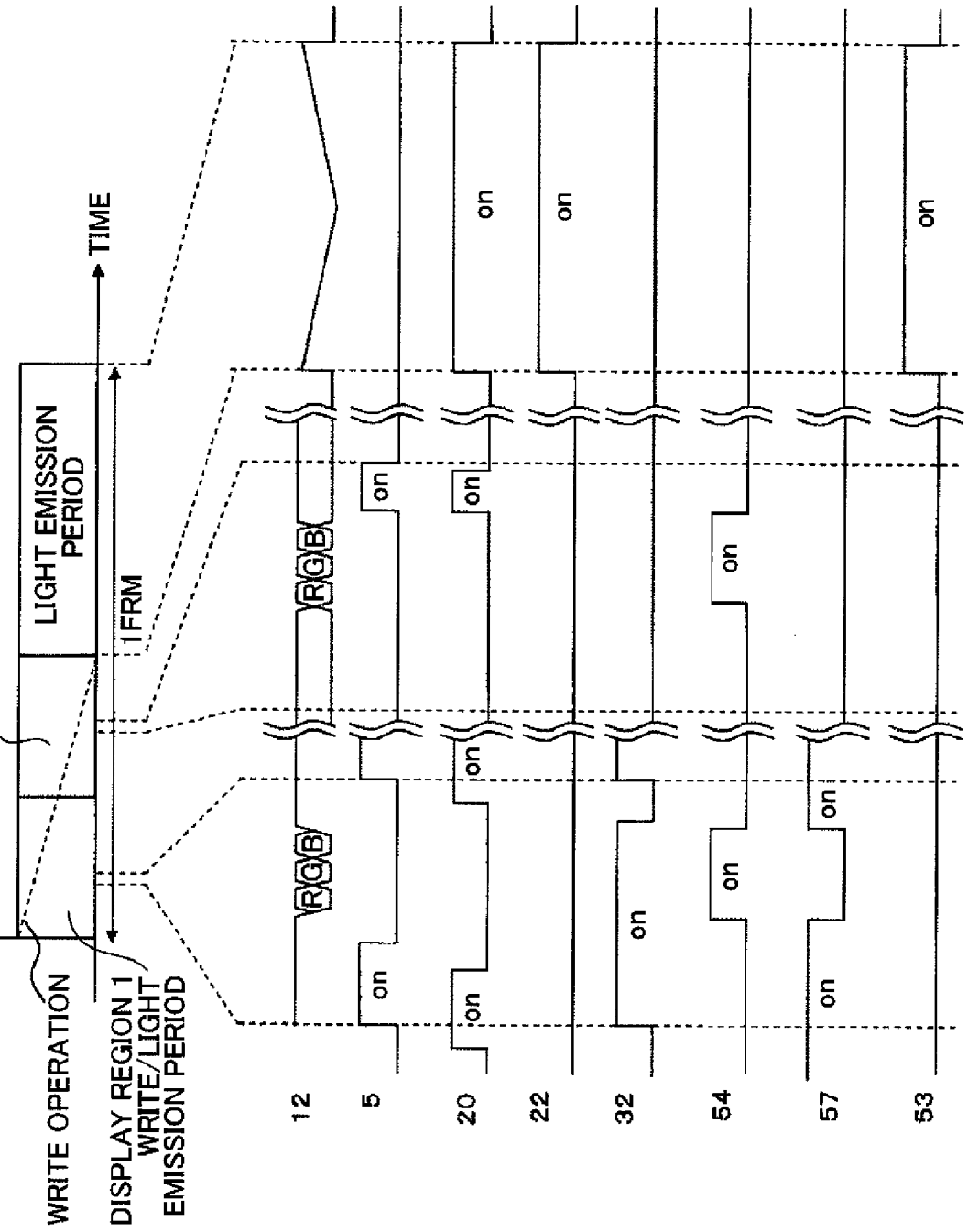

IMAGE DISPLAY DEVICE

CROSS-REFERENCE TO RELATED APPLICATION

The present application claims priority from Japanese application JP2009-025833 filed on Feb. 6, 2009, the content of which is hereby incorporated by reference into this application.

BACKGROUND OF THE INVENTION

1. Field of the Invention

The present invention relates to an image display device using, for example, an organic electroluminescence (EL) element, and more particularly, to an image display device capable of displaying a high-quality image with high definition at low voltage.

2. Description of the Related Art

In recent years, the demand has been increased for flat panel display devices instead of cathode ray tube (CRT) display devices, which are the mainstream of conventional display devices. In particular, an organic EL display device using an organic EL element such as an organic light-emitting diode (OLED) is excellent in terms of power consumption, weight, thickness, video image characteristic, view angle, and the like, and hence the development and practical use are advanced.

In the organic EL display device, each pixel has a driving transistor for driving the organic EL element. When a fluctuation in threshold voltage Vth of the driving transistor of each pixel is large, a fluctuation in light emission characteristic of each pixel occurs to reduce the uniformity of a screen, and hence high quality cannot be maintained.

The driving transistor for driving the organic EL element is normally a thin film transistor. The thin film transistor has a large fluctuation in threshold voltage Vth.

Therefore, the organic EL display device has the following problem. That is, the fluctuation in threshold voltage Vth of the driving transistor of each pixel becomes larger, and hence the fluctuation in light emission characteristic of each pixel occurs to reduce the uniformity of the screen. Thus, high quality cannot be maintained.

In view of this point, it is necessary for the organic EL display device to cancel the fluctuation in threshold voltage Vth of the driving transistor of each pixel.

An image display device in which the fluctuation in threshold voltage Vth of the driving transistor of each pixel is cancelled is disclosed in, for example, R. M. A. Dawson et al., "Design of an Improved Pixel for a Polysilicon Active-Matrix Organic LED Display," SID Symposium Digest 29 11 (1998).

FIG. 13 is a circuit diagram illustrating an equivalent circuit of an example of a pixel of a conventional organic EL display device, which illustrates an equivalent circuit of a most typical pixel employing a voltage program system.

A signal line 12, a selection switch line Y, and a power supply line 6 are led to a pixel 1 illustrated in FIG. 13.

The pixel 1 includes an organic electroluminescence element (hereinafter referred to as organic EL element) 2 serving as a light emitting element.

The organic EL element 2 has a cathode electrode connected to a common ground line, and an anode electrode connected to the power supply line 6 through a p-type thin film transistor (hereinafter referred to as driving TFT) 4.

A holding capacitor element 3 is connected between a gate electrode and a source electrode of the driving TFT 4. The gate electrode of the driving TFT 4 is connected to the signal line 12 through a selection switch element 32 consisting of an n-type thin film transistor. A gate electrode of the selection switch element 32 is connected to the selection switch line Y.

FIG. 14 is a time chart for illustrating an operation of the pixel 1 illustrated in FIG. 13.

In the organic EL display device having the pixel 1 illustrated in FIG. 13, one frame period (FRM) includes a write period and a light emission period. An image voltage is written into the pixel 1 during the write period. Light is emitted for display during the light emission period. The writing of the image voltage is performed for each display line, that is, for each selection switch line Y.

First, as illustrated in FIG. 14, during the write period, the selection switch element 32 is turned on. Then, an analog image voltage is supplied from the signal line 12, and the image voltage is input to the holding capacitor element 3.

During the light emission period, the organic EL element 2 emits light. During the light emission period, the selection switch element 32 is turned off, and hence a voltage corresponding to the image voltage which has been stored in the holding capacitor element 3 is applied to the gate electrode of the driving TFT 4, with the result that a current corresponding to the applied voltage flows through the organic EL element 2, to thereby adjust light emission luminance.

FIG. 15 is a circuit diagram illustrating an equivalent circuit of another example of a pixel of a conventional organic EL display device, and the pixel illustrated in FIG. 15 is a most typical pixel employing a voltage program system.

A signal line 12, a reset line 7, a selection switch line Y, a lighting switch line 21, and a power supply line 6 are led to the pixel 1 illustrated in FIG. 15.

The pixel 1 includes an organic EL element 2 serving as a light emitting element.

The organic EL element 2 has a cathode electrode connected to a common ground line, and an anode electrode connected to the power supply line 6 through a lighting switch element 20 consisting of an n-type thin film transistor and a driving TFT 4 consisting of an p-type thin film transistor.

A second holding capacitor element 30 is connected between a gate electrode and a source electrode of the driving TFT 4. A reset switch element 5 consisting of an n-type thin film transistor is provided between a drain electrode and the gate electrode of the driving TFT 4. Further, the gate electrode of the driving TFT 4 is connected to the signal line 12 through a first holding capacitor element 3 and a selection switch element 32 consisting of an n-type thin film transistor.

A gate electrode of the reset switch element 5 is connected to the reset line 7. A gate electrode of the selection switch element 32 is connected to the selection switch line Y. A gate electrode of the lighting switch element 20 is connected to the lighting switch line 21.

In the organic EL display device having the pixel 1 illustrated in FIG. 15, one frame period (FRM) includes a write period and a light emission period. An image voltage is written into the pixel 1 during the write period. Light is emitted for display during the light emission period. The writing of the image voltage is performed for each display line, that is, for each selection switch line Y.

FIG. 16 is a time chart for illustrating an operation of the pixel 1 illustrated in FIG. 15.

In the following, an operation during each of the write period and the light emission period is described.

First, as illustrated in FIG. 16, during a period between a time t1 and a time t2 of the write period, the reset switch element 5 and the lighting switch element 20 are turned on. As a result, the driving TFT 4 has a diode connection in which the gate electrode is connected to the drain electrode, and hence a voltage of the gate electrode of the driving TFT 4 which has been stored in each of the holding capacitor elements (3 and 30) in a preceding field is cleared.

Next, when the lighting switch element 20 is turned off at the time t2, the driving TFT 4 and the organic EL element 2 forcedly become a current off state. At this time, the gate electrode and the drain electrode of the driving TFT 4 are short-circuited through the reset switch element 5, and hence the voltage of the gate electrode of the driving TFT 4, the gate electrode also corresponding to one end of the first holding capacitor element 3, is automatically reset to a voltage (VDD-Vth) which is lower than a voltage VDD of the power supply line 6 by a threshold voltage Vth.

During a period between the time t1 and the time t3, a fixed voltage (reference voltage) is supplied to the signal line 12. Further, the selection switch element 32 is turned on during the period between the time t1 and the time t3. Therefore, the fixed voltage (reference voltage) is input from the signal line 12 to the other end of the first holding capacitor element 3.

Next, at the time t3, the reset switch element 5 is turned off. After that, an analog image voltage is supplied to the signal line 12, and the image voltage is input to the other end of the first holding capacitor element 3.

During the light emission period starting from the time t5, the reset switch element 5 and the selection switch element 32 are turned off and the lighting switch element 20 is turned on, and hence the organic EL element 2 emits light.

During the light emission period, a voltage corresponding to the change from the reference voltage to the image voltage is applied to the gate electrode of the driving TFT 4, and hence a current corresponding to the applied voltage flows through the organic EL element 2, to thereby adjust light emission luminance.

As described above, in each pixel 1 of the organic EL display device illustrated in FIG. 15, the voltage of the gate electrode of the driving TFT 4 is automatically reset to the voltage (VDD-Vth) which is lower than the voltage VDD on the power supply line 6 by the threshold voltage Vth. Therefore, the fluctuation in threshold voltage of the driving TFT 4 is suppressed, and hence the light emission with high uniformity may be realized.

SUMMARY OF THE INVENTION

FIG. 12 is a diagram for illustrating a problem which arises in an organic EL display device which includes one of the pixels illustrated in FIGS. 13 and 15.

In general, an organic EL display panel carries out display in high luminance in order to increase visibility. Further, in a case of displaying textual information or the like, a high-contrast display (in which, for example, characters are displayed at a highest tone while the rest is displayed at a lowest tone) is carried out.

As illustrated in FIG. 12, in a case where a display region 1 (AR1) for displaying a still image such as textual information and a display region 2 (AR2) for displaying a video image are provided by employing a conventional technology, a current amount at a highest tone in the display region 1 (AR1) is fixed to a current amount defined by a maximum luminance in the display region 2 (AR2).

Accordingly, in the display region 1 (AR1), the rate of degradation of the organic EL element 2 largely varies between a pixel which is turned on at a high tone over a long time and a pixel which is not turned on. The pixels adjacent to each other bear a significant luminance difference along with the degradation over time, which appears as burn-in. Burn-in appears more significantly in the display region 1 (AR1), which displays a fixed pattern for a long time, as compared with the display region 2 (AR2).

Further, in the conventional technology, the display is driven by a hold drive that the light is emitted for one frame period after inputting of a video signal. Accordingly, when a video image is displayed, the image lag on the human eye causes a motion blur.

The present invention has been made to solve the problems of the conventional technologies described above, and therefore, it is an object of the present invention to provide an image display device having a pixel structure which may be suitably applied to a case that, for example, the display area is divided into a region for displaying a still image and a region for displaying a video image.

The above and other objects and novel features of the present invention become apparent from the description of this specification and the accompanying drawings.

Representative aspects of the invention disclosed in this application are generally and briefly described as follows. (1) There is provided an image display device including: a display area which includes a plurality of pixels each of which includes a self light-emitting element (such as an organic electroluminescence (EL) element); and a plurality of signal lines for inputting an image voltage to each of the plurality of pixels, in which: each of the plurality of pixels includes a field-effect transistor for driving the self light-emitting element based on the image voltage which is input through each of the plurality of signal lines to each of the plurality of pixels; and the display area is divided into at least two regions, based on a value on a (channel width-to-channel length) ratio of a channel width to a channel length of the field-effect transistor. (2) In the image display device according to item (1): the at least two regions are two regions including a first region and a second region; and the (channel width-to-channel length) ratio of the field-effect transistor in the first region is smaller than the (channel width-to-channel length) ratio of any field-effect transistor in the second region. (3) In the image display device according to item (2): the first region is a still image display region; and the second region is a video image display region. (4) There is provided an image display device including: a display area which includes a plurality of pixels each of which includes a self light-emitting element (such as an organic electroluminescence (EL) element); and a plurality of signal lines for inputting an image voltage to each of the plurality of pixels, each of the plurality of pixels includes a field-effect transistor for driving the self light-emitting element based on the image voltage which is input to each of the plurality of pixels, and the display area is divided into at least two regions, based on a pixel circuit configuration. (5) In the image display device according to item (4): the display area is divided into two regions including a first region and a second region; the first region is a still image display region; and the second region is a video image display region.

(6) In the image display device according to item (2) or (5): the first region of the display area includes a plurality of selection switch lines for inputting a selection voltage to each of the plurality of pixels; each of the plurality of pixels in the first region includes: a first holding capacitor element connected between a first electrode and a gate electrode of the field-effect transistor; and a selection switch element connected between a signal line of the plurality of signal lines and the gate electrode of the field-effect transistor; the selection switch element is controlled to be turned on and off based on the selection voltage which is input through each of the plurality of selection switch lines to each of the plurality of pixels; the second region of the display area includes a plurality of reset lines for inputting a reset voltage to each of the plurality of pixels; each of the plurality of pixels in the second region includes: a second holding capacitor element connected between a signal line of the plurality of signal lines and the gate electrode of the field-effect transistor; and a reset switch element connected between the gate electrode and a second electrode of the field-effect transistor; and the reset switch element is controlled to be turned on and off based on the reset voltage which is input through each of the plurality of reset lines to each of the plurality of pixels.

(7) In the image display device according to item (2) or (5): the first region of the display area includes: a plurality of selection switch lines for inputting a selection voltage to each of the plurality of pixels; and a plurality of first reset lines for inputting a reset voltage to each of the plurality of pixels; each of the plurality of pixels in the first region includes: a first holding capacitor element connected between a first electrode and a gate electrode of the field-effect transistor; a second holding capacitor element whose one electrode connected to the gate electrode of the field-effect transistor; a selection switch element connected between a signal line of the plurality of signal lines and another electrode of the second holding capacitor element; and a first reset switch element connected between the gate electrode and a second electrode of the field-effect transistor; the selection switch element is controlled to be turned on and off based on the selection voltage which is input through each of the plurality of selection switch lines to each of the plurality of pixels; the first reset switch element is controlled to be turned on and off based on the reset voltage which is input through each of the plurality of first reset lines to each of the plurality of pixels; the second region of the display area includes a plurality of second reset lines for inputting a reset voltage to each of the plurality of pixels; each of the plurality of pixels in the second region includes: a third holding capacitor element connected between a signal line of the plurality of signal lines and the gate electrode of the field-effect transistor; and a second reset switch element connected between the gate electrode and the second electrode of the field-effect transistor; and the second reset switch element is controlled to be turned on and off based on the reset voltage which is input through each of the plurality of second reset lines to each of the plurality of pixels.

(8) In the image display device according to item (6) or (7): the first region and the second region of the display area each include a plurality of lighting switch lines for inputting a lighting voltage to each of the plurality of pixels; each of the plurality of pixels in the first region and the second region includes a lighting switch element connected between the second electrode of the field-effect transistor and the self light-emitting element; and the lighting switch element is controlled to be turned on and off based on the lighting voltage input to each of the plurality of pixels through each of the plurality of lighting switch lines.

An effect obtained by the representative aspects of the invention disclosed in this application is briefly described as follows.

According to the present invention, there may be implemented an image display device having a pixel structure suitably applied to a case that a display area is divided into a region for displaying a still image and a region for displaying a video image.

BRIEF DESCRIPTION OF THE DRAWINGS

In the accompanying drawings:

FIG. 2 is a block diagram illustrating an entire configuration of an image display device according to a first embodiment of the present invention;

FIG. 3B illustrates another pixel layout of the image display device according to the first embodiment of the present invention;

FIG. 8 is a time chart for illustrating operations of the pixels illustrated in FIGS. 7A and 7B;

FIG. 11 is a time chart for illustrating operations of the pixels illustrated in FIGS. 10A and 10B;

DETAILED DESCRIPTION OF THE INVENTION

Hereinafter, embodiments of the present invention are described in detail with reference to the attached drawings.

Throughout the explanatory drawings for the embodiments, elements having the same functions are expressed by the same reference symbols and the duplicated description thereof is omitted.

(An Overview of an Image Display Device According to the Present Invention)

Figure 1A:
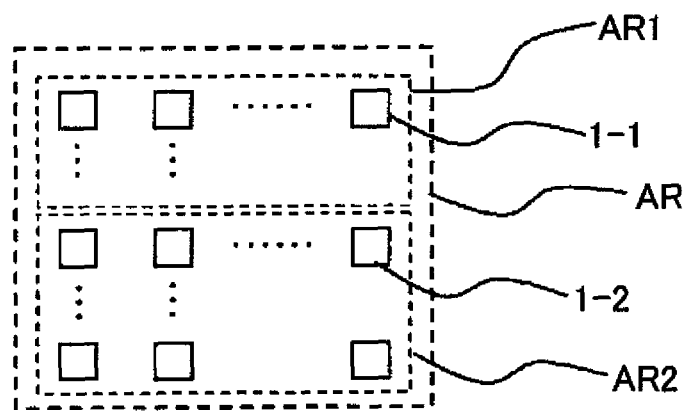
FIGS. 1A and 1B each illustrate pixels corresponding to basic components according to the present invention.
Figure 1B:
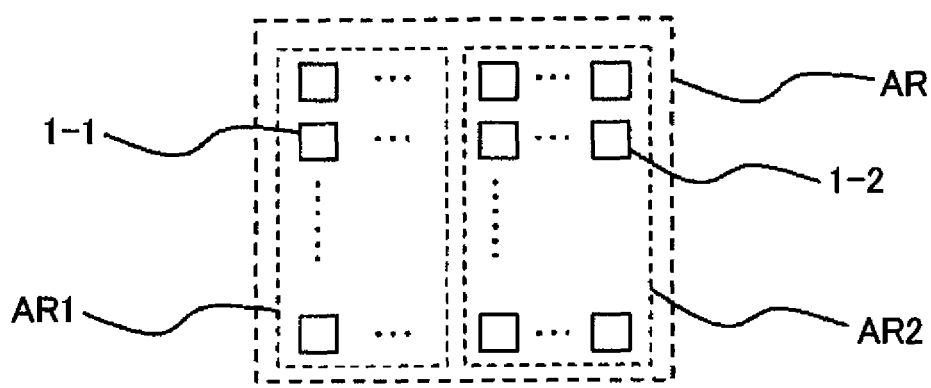

FIGS. 1A and 1B schematically illustrate an image display device according to the present invention.

According to the present invention, as illustrated in FIGS. 1A and 1B, an image display area AR is divided into two regions, namely, a display region 1 (AR1) and a display region 2 (AR2), according to display information. In each of the display regions, pixels are driven in a manner suited for the display information to be displayed in the region. A pixel 1 (1-1) in the display region 1 (AR1) is different in pixel configuration from a pixel 2 (1-2) in the display region 2

(AR2). A description is given of how to drive each pixel in a manner suited for the display, with reference to the embodiments.

The display area may be divided into an upper part and a lower part as illustrated in FIG. 1A, or may be divided into a right part and a left part as illustrated in FIG. 1B.

Further, the display area may be divided into three or more regions. It goes without saying that the display area may be divided in any pattern other than the two patterns illustrated in FIGS. 1A and 1B.

First Embodiment

FIG. 2 is a block diagram illustrating an entire configuration of an image display device according to a first embodiment of the present invention. In FIG. 2, reference numeral 1-1 denotes the pixel 1, 1-2 denotes the pixel 2, 6 denotes a power supply line, 8 denotes a scan line drive circuit, 9 denotes a signal line drive circuit, 12 denotes a signal line, and 51 denotes a signal input line, and reference symbol AR1 denotes the display region 1, AR2 denotes the display region 2, and Y denotes a selection switch line.

Figure 3A:
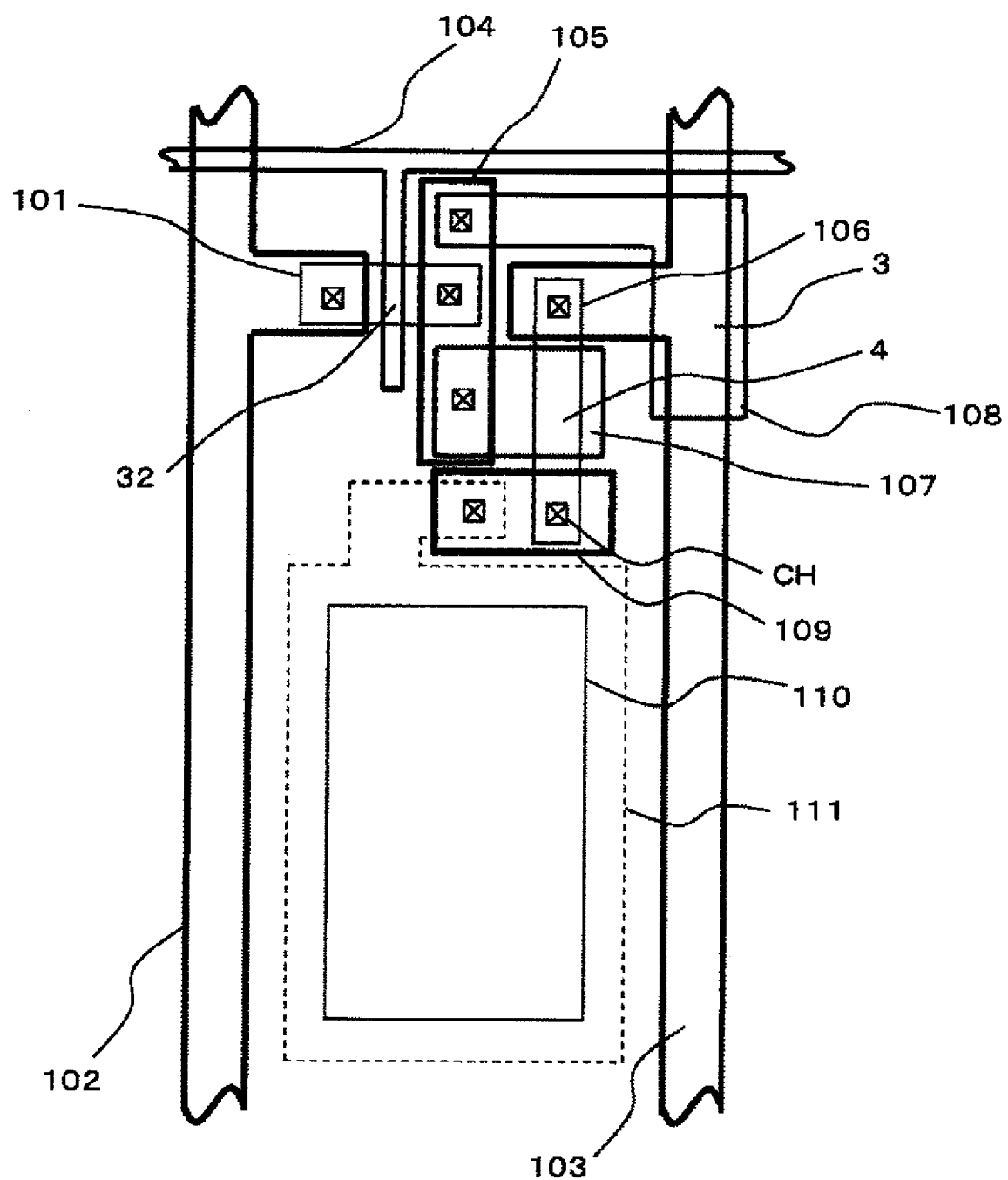
FIG. 3A illustrates a pixel layout of the image display device according to the first embodiment of the present invention.

FIGS. 3A and 3B each illustrate a pixel layout of the image display device according to the first embodiment of the present invention. An equivalent circuit of each of the pixels illustrated in FIGS. 3A and 3B is similar to an equivalent circuit illustrated in FIG. 13.

In FIGS. 3A and 3B, reference numeral 101 denotes a semiconductor film of an n-type thin film transistor for forming a selection switch element 32, 102 denotes wiring for forming the signal line 12, 103 denotes wiring for forming the power supply line 6, 104 denotes gate electrode wiring for forming the selection switch line Y, 105 and 109 denote wiring, 106 denotes a semiconductor film for forming a driving TFT 4, 107 denotes gate electrode wiring for forming the driving TFT 4, 108 denotes wiring for forming one of electrodes of a holding capacitor element 3, 110 denotes an organic EL film, and 111 denotes an anode electrode of an organic EL element, and reference symbol CH denotes a contact hole.

The pixel 1 (1-1) in the display region 1 (AR1) of FIG. 2 corresponds to the pixel layout of FIG. 3A, while the pixel 2 (1-2) in the display region 2 (AR2) of FIG. 2 corresponds to the pixel layout of FIG. 3B.

As illustrated in FIGS. 3A and 3B, the driving TFT 4 of the display region 1 (AR1), which mainly displays a still image, is adapted to have a "channel width-to-channel length" value smaller than a "channel width-to-channel length" value of the driving TFT 4 of the display region 2 (AR2), which mainly displays a video image.

With this configuration, even in a case where the pixel 1 (1-1) and the pixel 2 (1-2) are applied with the same image voltage, the pixel 1 (1-1) becomes lower in luminance than the pixel 2 (1-2), which reduces the rate of deterioration of the organic EL element 2, to thereby suppress burn-in.

Second Embodiment

Figure 4:
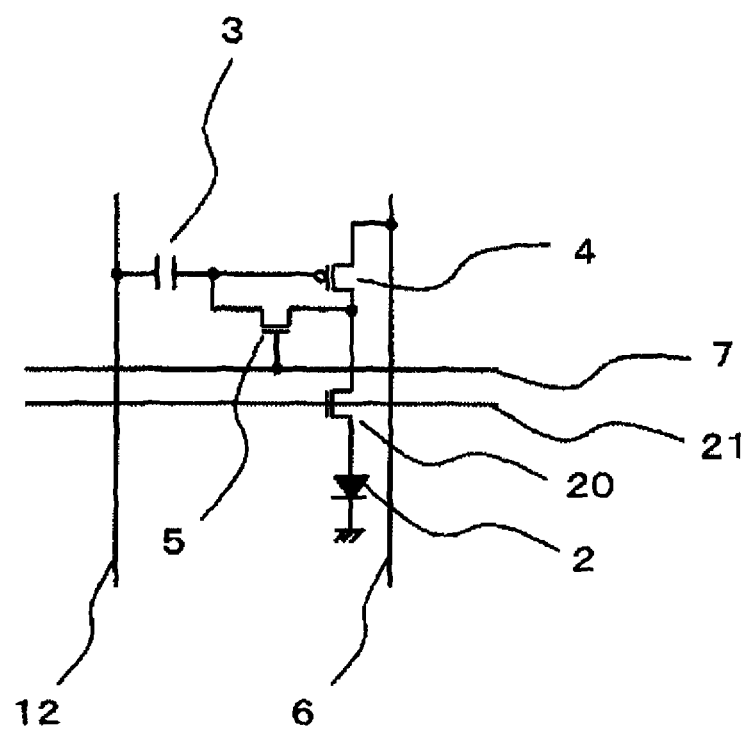
FIG. 4 is a circuit diagram illustrating an equivalent circuit of a pixel applied to an image display device according to a second embodiment of the present invention.
Figure 5:
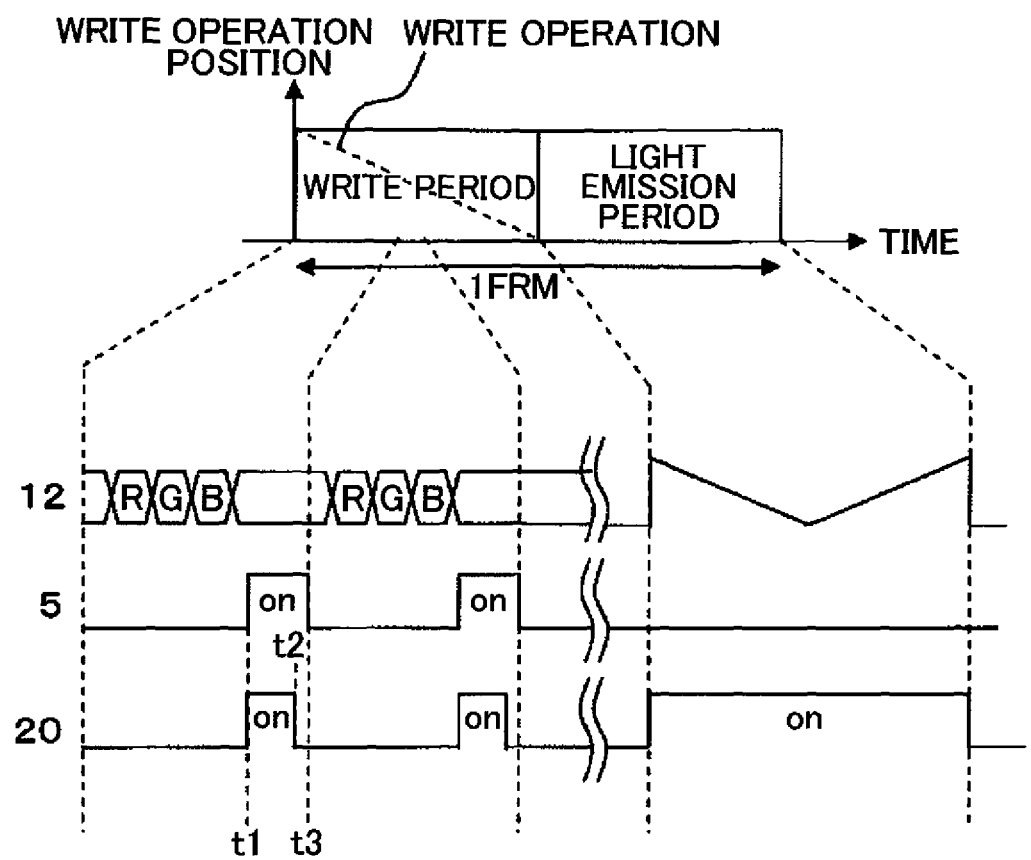
FIG. 5 is a time chart for illustrating an operation of the pixel illustrated in FIG. 4.

FIG. 4 is a circuit diagram illustrating an equivalent circuit of one pixel applied to an image display device according to a second embodiment of the present invention, and FIG. 5 is a time chart for illustrating an operation of the pixel illustrated in FIG. 4.

Figure 15:
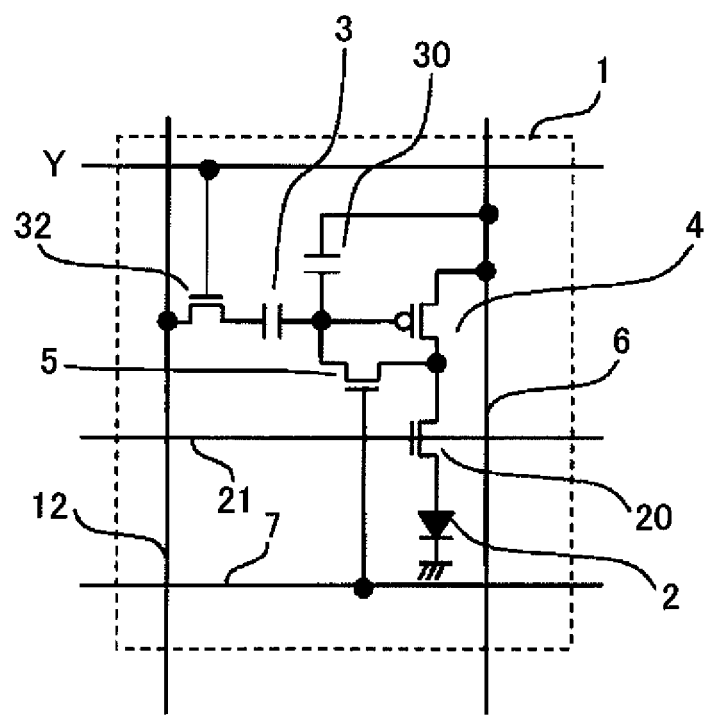
FIG. 15 is a circuit diagram illustrating an equivalent circuit of another example of the one pixel of a conventional organic EL display device.

In the case of the pixel illustrated in FIG. 4, the number of elements included in the pixel circuit is reduced as compared with the pixel illustrated in FIG. 15.

As illustrated in FIG. 4, the organic EL element 2 has a cathode electrode connected to a common ground line, and an anode electrode connected to the power supply line 6 through a lighting switch element 20 consisting of an n-type thin film transistor and the driving TFT (p-type thin film transistor) 4.

A reset switch element 5 consisting of an n-type thin film transistor is provided between a drain electrode and a gate electrode of the driving TFT 4. The gate electrode of the driving TFT 4 is connected to the signal line 12 through the holding capacitor element 3.

A gate electrode of the reset switch element 5 is connected to a reset line 7. A gate electrode of the lighting switch element 20 is connected to a lighting switch line 21.

In the case of the pixel illustrated in FIG. 4, the number of elements included in the pixel is reduced. Accordingly, it is necessary to divide one frame period (FM) into a write period and a light emission period.

In the following, an operation during each of the write period and the light emission period is described with reference to FIG. 5.

First, at a time t1 of the write period, the lighting switch element 20 and the reset switch element 5 are turned on. As a result, the driving TFT 4 has a diode connection in which the gate electrode is connected to the drain electrode, and hence a voltage of the gate electrode of the driving TFT 4 which has been stored in the holding capacitor element 3 in a preceding field is cleared.

Next, when the lighting switch element 20 is turned off at a time t2, the driving TFT 4 and the organic EL element 2 forcedly become a current off state. At this time, the gate electrode and the drain electrode of the driving TFT 4 are short-circuited through the reset switch element 5, and hence the voltage of the gate electrode of the driving TFT 4, the gate electrode also corresponding to one end of the holding capacitor element 3, is automatically reset to a voltage (VDD-Vth) which is lower than a voltage VDD on the power supply line 6 by a threshold voltage Vth. At this time, an analog image voltage Vs (k) is input from the signal line 12 to the other end of the holding capacitor element 3.

Next, at a time t3, the reset switch element 5 is turned off, and hence the writing of an analog image voltage into the pixel is stopped. In this manner, the writing of an analog image voltage into a pixel is sequentially performed for each display line. After the writing into all the pixels is completed, the "write period" ends.

During the "light emission period", the reset switch element 5 is turned off while the lighting switch element 20 of each of all the pixels is simultaneously turned on.

At this time, a triangular wave voltage illustrated in FIG. 5 is input to the signal line 12. The organic EL element 2 of each pixel is driven by the driving TFT 4 based on a voltage relationship between the analog image voltage Vs (k) which is written in advance and the triangular wave voltage applied to the signal line 12. More specifically, the driving TFT 4 causes a current corresponding to a differential voltage between the analog image voltage Vs (k) which is written in advance and the triangular wave voltage applied to the signal line 12 to flow through the organic EL element 2 of each pixel.

In this case, when a mutual conductance (gm) of the driving TFT 4 is sufficiently large, the organic EL element 2 may be assumed to be driven in such a digital manner as to be turned on and off. More specifically, the organic EL element 2 continues to emit light at a substantially constant luminance during only a period depending on the analog image voltage value Vs (k) which is written in advance. The modulation of the light emission time period is visually recognized as multi-gradation light emission.

Further, in the pixel illustrated in FIG. 4, the organic EL element 2 is forcedly turned off during the write period, to thereby eliminate an image lag on the human eye. As a result, a motion blur may be suppressed.

Figure 6:
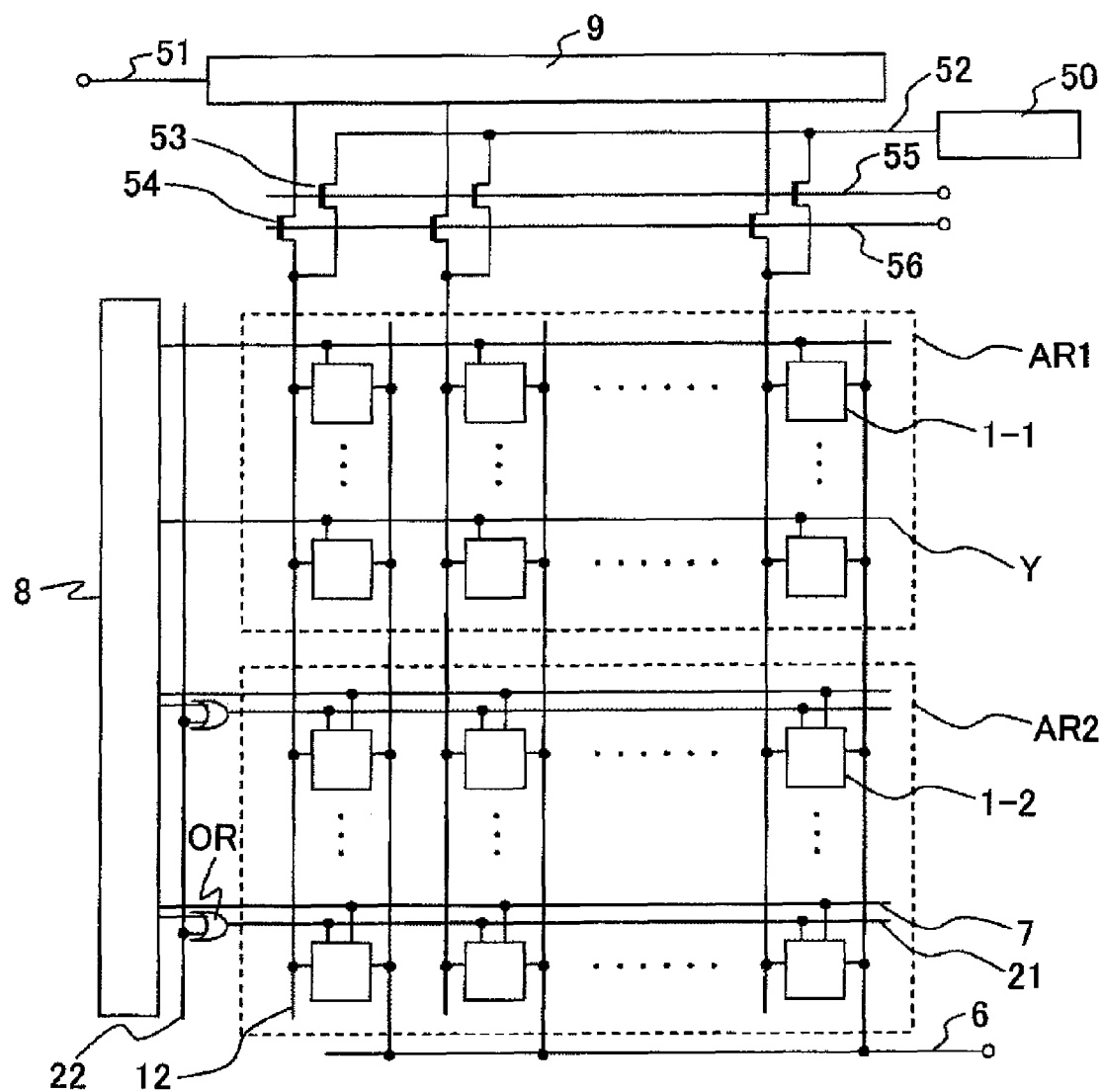
FIG. 6 is a block diagram illustrating an entire configuration of the image display device according to the second embodiment of the present invention.

FIG. 6 is a block diagram illustrating an entire configuration of the image display device according to the second embodiment of the present invention. In FIG. 6, reference numeral 1-1 denotes the pixel 1, 1-2 denotes the pixel 2, 6 denotes the power supply line, 7 denotes the reset line, 8 denotes the scan line drive circuit, 9 denotes the signal line drive circuit, 12 denotes the signal line, 21 denotes the lighting switch line, 22 denotes a lighting control line, 50 denotes a triangular wave generation circuit, 51 denotes the signal input line, 52 denotes a triangular wave generator, 53 denotes a triangular wave selection switch element, 54 denotes a signal line selection switch element, 55 denotes a triangular wave selection switch control line, and 56 denotes a signal line selection switch control line, and reference symbol AR1 denotes the display region 1, AR2 denotes the display region 2, Y denotes the selection switch line, and OR denotes an OR circuit.

Figure 7A:
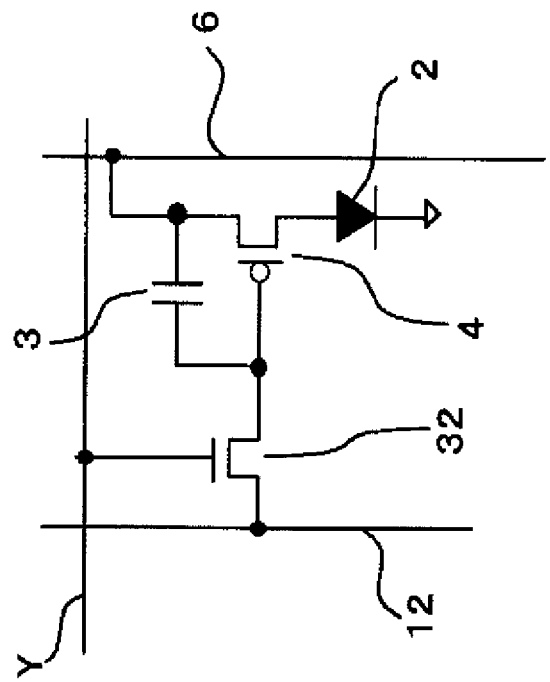
FIGS. 7A and 7B each are a circuit diagram illustrating an equivalent circuit of a pixel circuit of the image display device according to the second embodiment of the present invention.
Figure 7B:
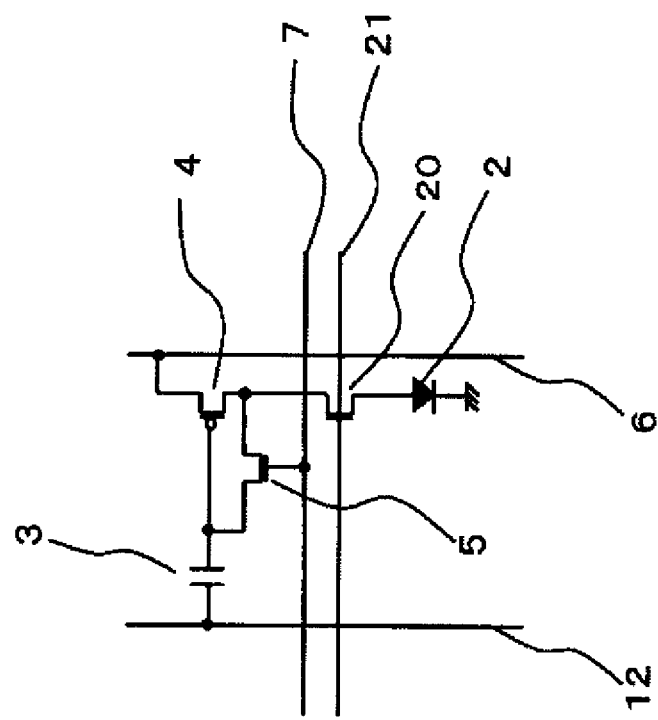

FIGS. 7A and 7B each are a circuit diagram illustrating an equivalent circuit of a pixel circuit of the image display device according to the second embodiment of the present invention.

In this embodiment, the display region 1 (AR1) of FIG. 6 is a still image display area for mainly displaying a still image, in which a pixel illustrated by an equivalent circuit of FIG. 7A is employed as the pixel 1 of the display region 1 (AR1). The display region 2 (AR2) of FIG. 6 is a video image display area for mainly displaying a video image, in which a pixel illustrated by an equivalent circuit of FIG. 7B is employed as the pixel 2 of the display region 2 (AR2).

Figure 13:
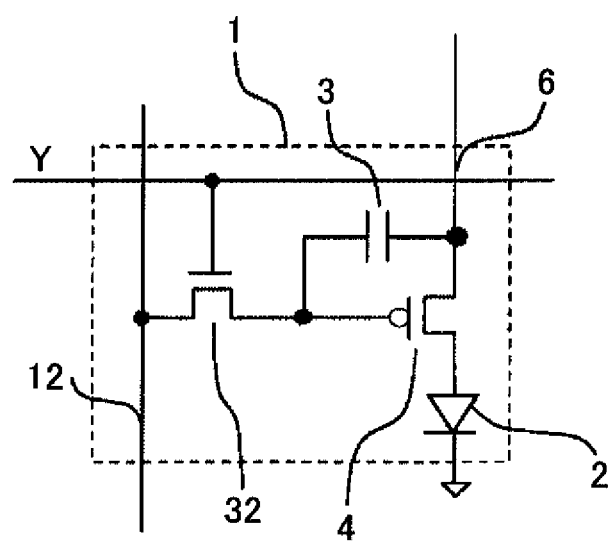
FIG. 13 is a circuit diagram illustrating an equivalent circuit of an example of one pixel of a conventional organic EL display device.

Here, the pixel of FIG. 7A is similar to the pixel illustrated in FIG. 13, and the pixel of FIG. 7B is similar to the pixel illustrated in FIG. 4. Further, similarly to the first embodiment described above, the driving TFT 4 of the display region 1 (AR1) is adapted to have a "channel width-to-channel length" value smaller than a "channel width-to-channel length" value of the driving TFT 4 of the display region 2 (AR2).

With this configuration, even in a case where the pixel 1 (1-1) and the pixel 2 (1-2) are applied with the same image voltage, the pixel 1 (1-1) becomes lower in luminance than the pixel 2 (1-2), which reduces the rate of deterioration of the organic EL element 2, to thereby suppress burn-in.

FIG. 8 is a time chart for illustrating operations of the pixels illustrated in FIGS. 7A and 7B.

Figure 14:
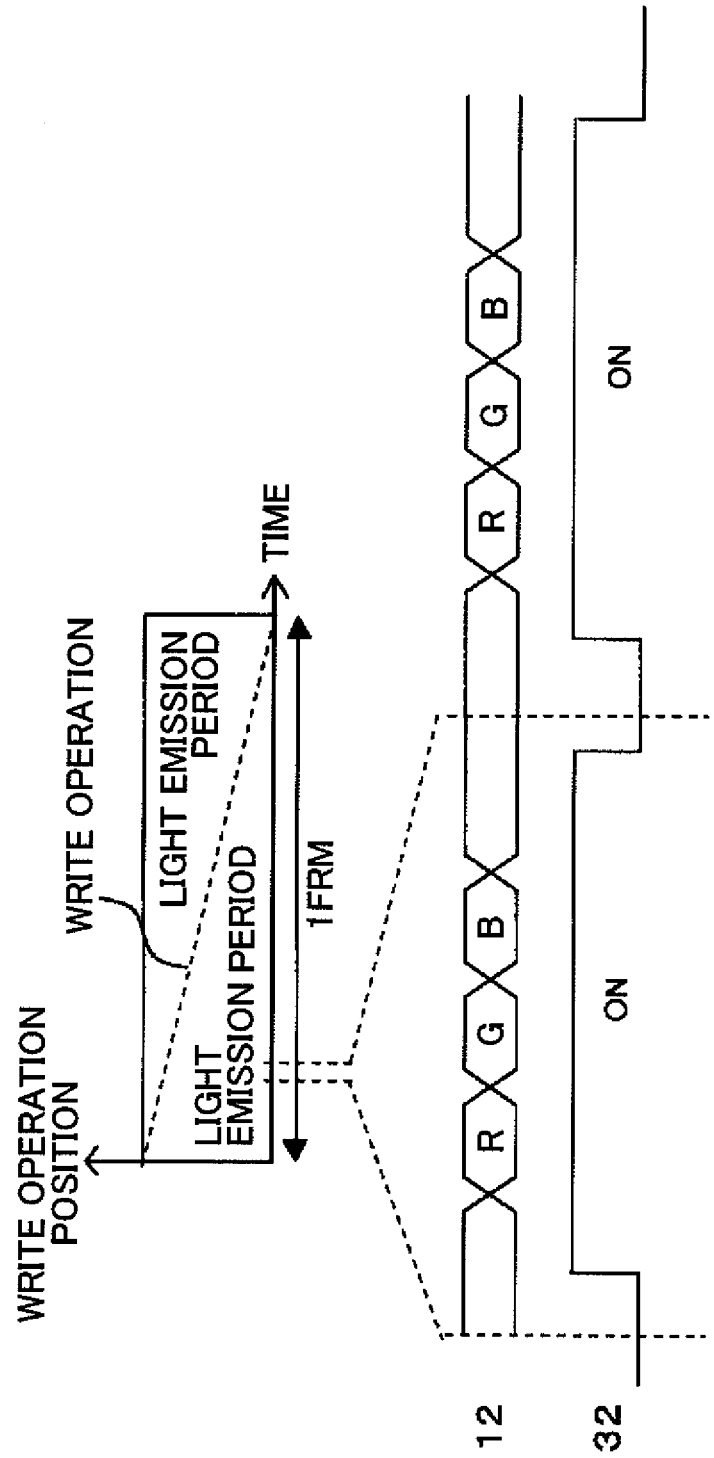
FIG. 14 is a time chart for illustrating an operation of the one pixel illustrated in FIG. 13.

As illustrated in FIG. 8, in principle, the pixel 1 (1-1) is driven in a manner similar to that illustrated in FIG. 14, and the pixel 2 (1-2) is driven in a manner similar to that illustrated in FIG. 5.

The pixel 1 (1-1) of the display region 1 (AR1) emits light for one frame period (FRM) after receiving a signal voltage input during the "display region 1 write/light emission period" in the one frame period (FRM).

In the display region 2 (AR2), during the "write period", the scan line drive circuit 8 outputs a control voltage at High level for selecting each display line sequentially, and the control voltage is input to each OR circuit OR. Accordingly, each lighting switch line 21 connected to an output terminal of each OR circuit OR is sequentially raised to High level.

Further, during the "light emission period", the lighting control line 22 is raised to High level, and all the lighting switch lines 21 respectively connected to the output terminals of all the OR circuits OR are raised to High level. As a result, all the lighting switch elements 20 of all the pixels of the display region 2 (AR2) are turned on and the organic EL elements 2 of all the pixels emit light.

In this case, during the "display region 1 write period" and the "display region 2 write period", the triangular wave selection switch element 53 is turned off while the signal line selection switch element 54 is turned on, and the signal line 12 is connected to the signal line drive circuit 9. On the other hand, during the "light emission period", the triangular wave selection switch element 53 is turned on while the signal line selection switch element 54 is turned off, and the signal line 12 is connected to the triangular wave generation circuit 50.

As described above, the pixel 2 (1-2) of the display region 2 (AR2) stores a signal voltage in the holding capacitor element 3 during the "display region 2 write period" and emits light during only the "light emission period". With this configuration, the quality of a video image displayed in the display region 2 (AR2) may be enhanced.

Third Embodiment

Figure 9:
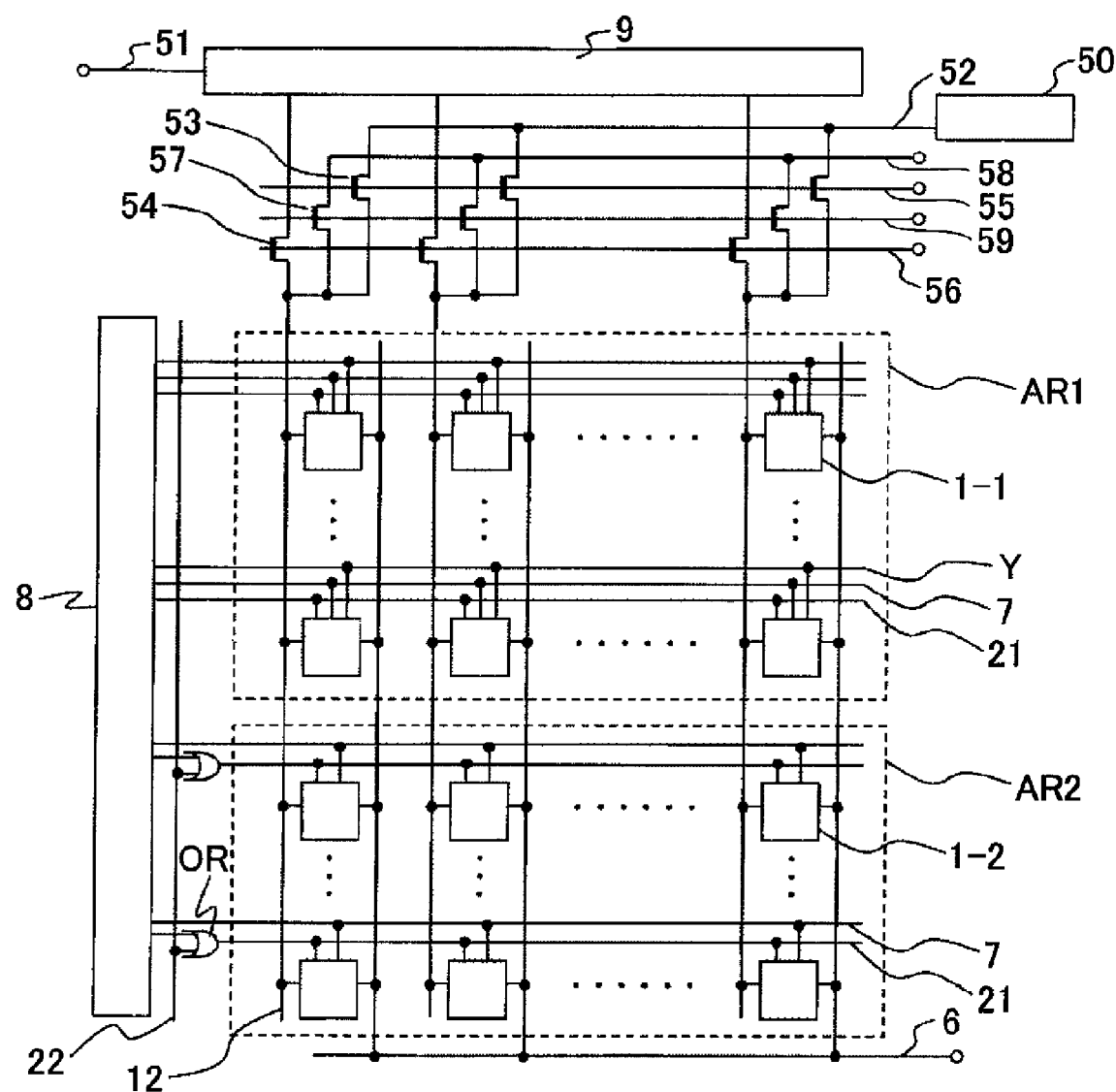
FIG. 9 is a block diagram illustrating an entire configuration of an image display device according to a third embodiment of the present invention.

FIG. 9 is a block diagram illustrating an entire configuration of an image display device according to a third embodiment of the present invention. In FIG. 9, reference numeral 1-1 denotes the pixel 1, 1-2 denotes the pixel 2, 6 denotes the power supply line, 7 denotes the reset line, 8 denotes the scan line drive circuit, 9 denotes the signal line drive circuit, 12 denotes the signal line, 21 denotes the lighting switch line, 22 denotes the lighting control line, 50 denotes the triangular wave generation circuit, 51 denotes the signal input line, 52 denotes the triangular wave generator, 53 denotes the triangular wave selection switch element, 54 denotes the signal line selection switch element, 55 denotes the triangular wave selection switch control line, 56 denotes the signal line selection switch control line, 57 denotes a reference signal selection switch element, 58 denotes a reference voltage line, and 59 denotes a reference signal selection switch control line, and reference symbol AR1 denotes the display region 1, AR2 denotes the display region 2, Y denotes the selection switch line, and OR denotes the OR circuit.

Figure 10B:
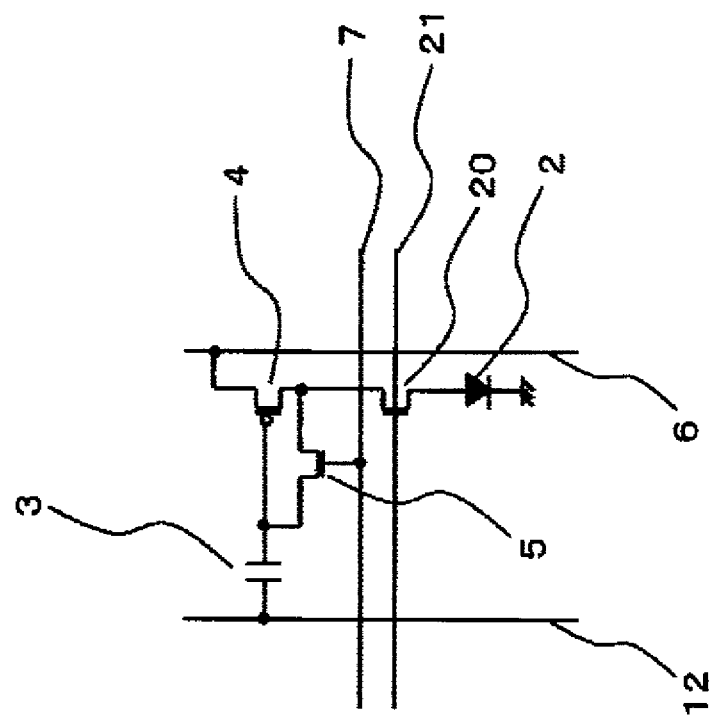
FIGS. 10A and 10B each are a circuit diagram illustrating an equivalent circuit of a pixel circuit of the image display device according to the third embodiment of the present invention.
Figure 10A:
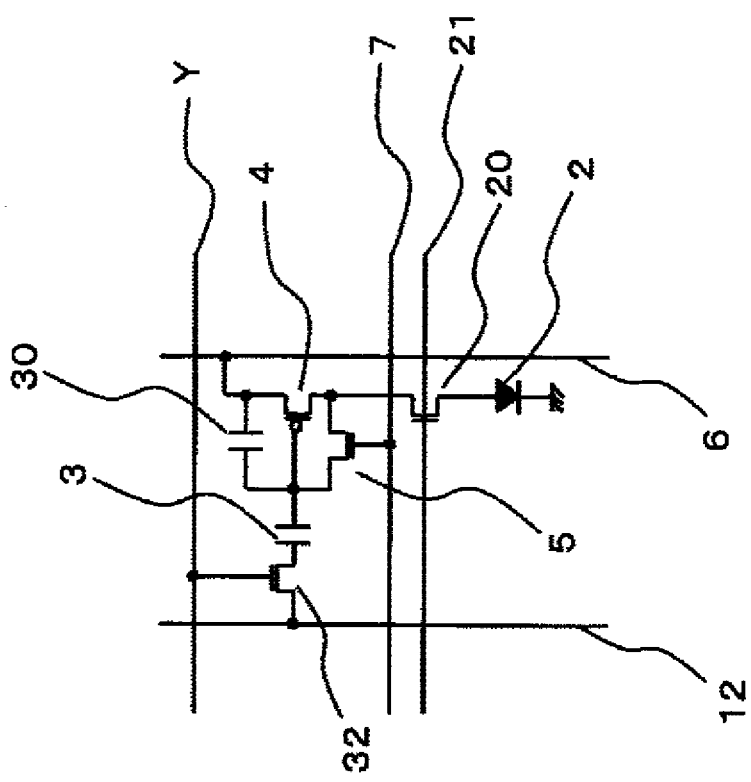
Figure 12:
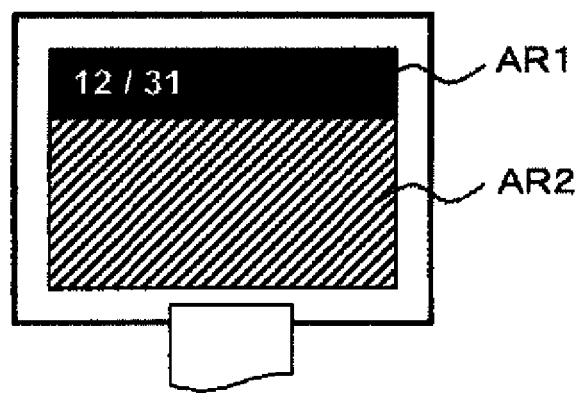
FIG. 12 is a diagram for illustrating a problem which arises in an organic EL display device including one of pixels illustrated in FIGS. 13 and 15.

FIGS. 10A and 10B each are a circuit diagram illustrating an equivalent circuit of a pixel circuit of the image display device according to the third embodiment of the present invention. In this embodiment, the display region 1 (AR1) of FIG. 9 is a still image display area for mainly displaying a still image, in which a pixel illustrated by an equivalent circuit of FIG. 10A is employed as the pixel 1 of the display region 1 (AR1). The display region 2 (AR2) of FIG. 9 is a video image display area for mainly displaying a video image, in which a pixel illustrated by an equivalent circuit of FIG. 10B is employed as the pixel 2 of the display region 2 (AR2).

Here, the pixel of FIG. 10A is similar to the pixel illustrated in FIG. 15, and the pixel of FIG. 10B is similar to the pixel illustrated in FIG. 4. Further, similarly to the first embodiment described above, the driving TFT 4 of the display region 1 (AR1) is adapted to have a "channel width-to-channel length" value smaller than a "channel width-to-channel length" value of the driving TFT 4 of the display region 2 (AR2).

With this configuration, even in a case where the pixel 1 (1-1) and the pixel 2 (1-2) are applied with the same image voltage, the pixel 1 (1-1) becomes lower in luminance than the pixel 2 (1-2), which reduces the rate of deterioration of the organic EL element 2, to thereby suppress burn-in.

FIG. 11 is a time chart for illustrating operations of the pixels illustrated in FIGS. 10A and 10B.

Figure 16:
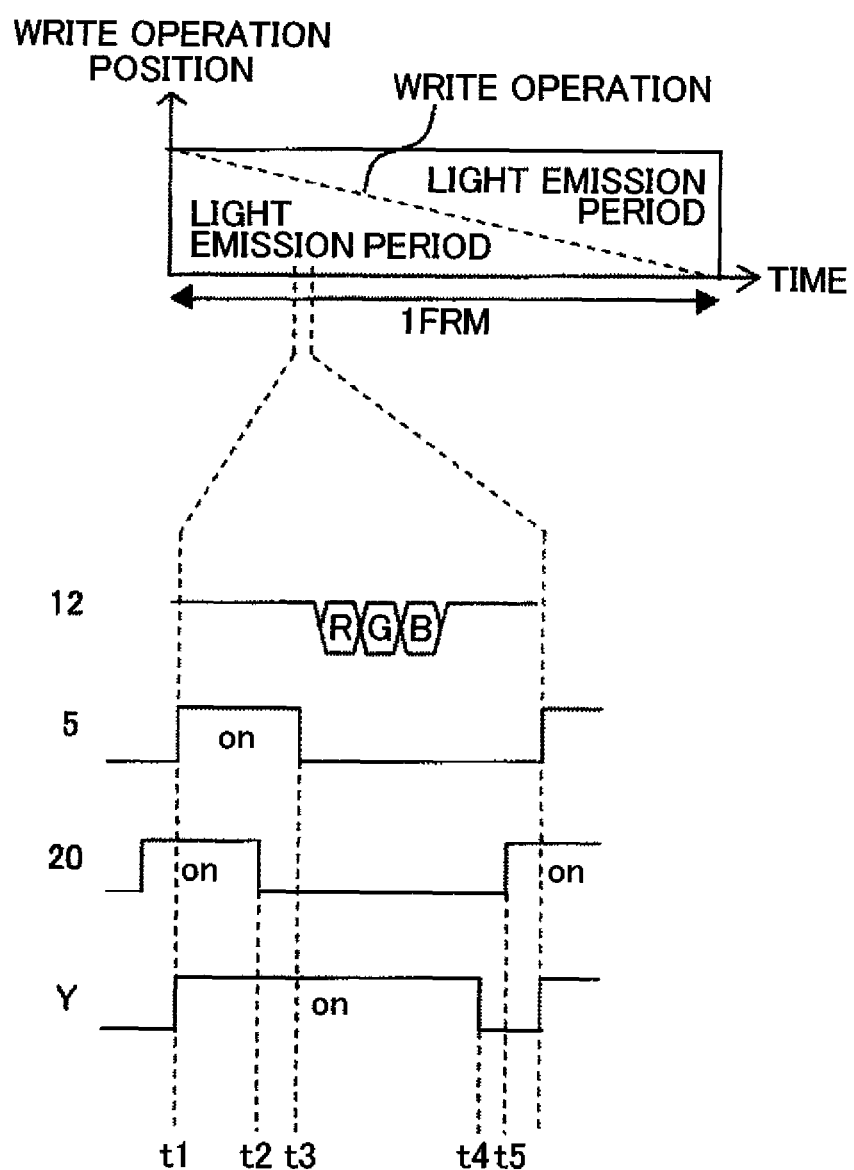
FIG. 16 is a time chart for illustrating an operation of the one pixel illustrated in FIG. 15.

As illustrated in FIG. 11, in principle, the pixel 1 (1-1) is driven in a manner similar to that illustrated in FIG. 16, and the pixel 2 (1-2) is driven in a manner similar to that illustrated in FIG. 5.

The pixel 1 (1-1) of the display region 1 (AR1) emits light for one frame period (FRM) after receiving a signal voltage input during the "display region 1 write/light emission period" in the one frame period (FRM).

In the display region 2 (AR2), during the "write period", the scan line drive circuit 8 sequentially outputs a control voltage at High level for selecting each display line, and the control voltage is input to each OR circuit OR. Accordingly, each lighting switch line 21 connected to the output terminal of each OR circuit OR is sequentially raised to High level.

Further, during the "light emission period", the lighting control line 22 is raised to High level, and all the lighting switch lines 21 respectively connected to the output terminals of all the OR circuits OR are raised to High level. As a result, all the lighting switch elements 20 of all the pixels of the display region 2 (AR2) are turned on and the organic EL elements 2 of all the pixels emit light.

In this case, during the "display region 1 write period", the triangular wave selection switch element 53 is turned off. However, when the signal line selection switch element 54 is turned on, the reference signal selection switch element 57 is turned off, and hence the signal line 12 is connected to the signal line drive circuit 9. On the other hand, when the signal line selection switch element 54 is turned off, the reference signal selection switch element 57 is turned on, and hence the signal line 12 is connected to the reference voltage line 58.

Meanwhile, during the "display region 2 write period", the triangular wave selection switch element 53 is turned off while the signal line selection switch element 54 is turned on and the reference signal selection switch element 57 is turned off. Accordingly, the signal line 12 is connected to the signal line drive circuit 9.

Further, during the "light emission period", the triangular wave selection switch element 53 is turned on while the signal line selection switch element 54 is turned off and the reference signal selection switch element 57 is turned off. Accordingly, the signal line 12 is connected to the triangular wave generation circuit 50.

As described above, the pixel 2 (1-2) of the display region 2 (AR2) stores a signal voltage in the holding capacitor element 3 during the "display region 2 write period" and emits light during only the "light emission period". With this configuration, the quality of a video image displayed in the display region 2 (AR2) may be enhanced.

It should be noted that in the second embodiment and the third embodiment described above, the driving TFT 4 of the display region 1 (AR1) is adapted to have a "channel width-to-channel length" value smaller than a "channel width-to-channel length" value of the driving TFT 4 of the display region 2 (AR2). Alternatively, in the second embodiment and the third embodiment described above, the driving TFT 4 of the display region 1 (AR1) may be adapted to have a "channel width-to-channel length" value which is substantially equal to a "channel width-to-channel length" value of the driving TFT 4 of the display region 2 (AR2). In this case, in the display region 2 (AR2), the organic EL element 2 is forcedly turned off during the write period in the one frame period (FRM), to thereby eliminate an image lag on the human eye. As a result, a motion blur may be suppressed.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An image display device, comprising:
a display area which includes a plurality of pixels each of which includes a self light-emitting element; and
a plurality of signal lines for inputting an image voltage to each of the plurality of pixels, wherein:
each of the plurality of pixels includes a field-effect transistor for driving the self light-emitting element based on the image voltage which is input through each of the plurality of signal lines to each of the plurality of pixels;
the display area is divided into at least two regions including a first region, which is configured of a first group of the plurality of pixels to comprise a still image display region, and a second region, which is configured of a second group of the plurality of pixels to comprise a video image display region, in a plane view so that the first group and second group of pixels do not overlap one another;
a ratio of a channel width to a channel length (channel width/channel length) of the field-effect transistors in the first region is smaller than the ratio of a channel width to a channel length of any field-effect transistor in the second region,
the first region of the display area comprises a plurality of selection switch lines for inputting a selection voltage to each of the plurality of pixels;
each of the plurality of pixels in the first region comprises:
a first holding capacitor element connected between a first electrode and a gate electrode of the field-effect transistor; and
a selection switch element connected between a signal line of the plurality of signal lines and the gate electrode of the field-effect transistor;
the selection switch element is controlled to be turned on and off based on the selection voltage which is input through each of the plurality of selection switch lines to each of the plurality of pixels;
the second region of the display area comprises a plurality of reset lines for inputting a reset voltage to each of the plurality of pixels;
each of the plurality of pixels in the second region comprises:
a second holding capacitor element connected between a signal line of the plurality of signal lines and the gate electrode of the field-effect transistor; and
a reset switch element connected between the gate electrode and a second electrode of the field-effect transistor;
and
the reset switch element is controlled to be turned on and off based on the reset voltage which is input through each of the plurality of reset lines to each of the plurality of pixels.

2. The image display device according to claim 1, wherein:
the first region of the display area includes a plurality of selection switch lines for inputting a selection voltage to each of the plurality of pixels;
each of the plurality of pixels in the first region includes:
a holding capacitor element connected between a first electrode and a gate electrode of the field-effect transistor; and
a selection switch element connected between a signal line of the plurality of signal lines and the gate electrode of the field-effect transistor; and
the selection switch element is controlled to be turned on and off based on the selection voltage which is input through each of the plurality of selection switch lines to each of the plurality of pixels.

3. The image display device according to claim 1, wherein:
the second region of the display area includes a plurality of reset lines for inputting a reset voltage to each of the plurality of pixels;
each of the plurality of pixels in the second region includes:
   a holding capacitor element connected between a signal line of the plurality of signal lines and a gate electrode of the field-effect transistor; and
   a reset switch element connected between the gate electrode and a second electrode of the field-effect transistor;
the reset switch element is controlled to be turned on and off based on the reset voltage which is input through each of the plurality of reset lines to each of the plurality of pixels.

4. The image display device according to claim 3, wherein:
the second region of the display area includes a plurality of lighting switch lines for inputting a lighting voltage to each of the plurality of pixels;
each of the plurality of pixels in the second region includes a lighting switch element connected between the second electrode of the field-effect transistor and the self light-emitting element; and
the lighting switch element is controlled to be turned on and off based on the lighting voltage which is input through each of the plurality of lighting switch lines to each of the plurality of pixels.

5. An image display device, comprising:
a display area which includes a plurality of pixels each of which includes a self light-emitting element; and
a plurality of signal lines for inputting an image voltage to each of the plurality of pixels, wherein:
each of the plurality of pixels includes a field-effect transistor for driving the self light-emitting element based on the image voltage which is input to each of the plurality of pixels;
the display area is divided into at least two regions including a first region, which is configured of a first group of the plurality of pixels to comprise a still image display region, and a second region, which is configured of a second group of the plurality of pixels to comprise a video image display region so that the first group and second group of pixels do not overlap one another;
the first region of the display area includes a plurality of selection switch lines for inputting a selection voltage to each of the plurality of pixels;
the second region of the display area includes a plurality of lighting switch lines for inputting a lighting voltage to each of the plurality of pixels and a plurality of reset lines for inputting a reset voltage to each of the plurality of pixels;
each of the plurality of pixels in the first region includes:
a first holding capacitor element connected between a first electrode and a gate electrode of the field-effect transistor; and
a selection switch element connected between a signal line of the plurality of signal lines and the gate electrode of the field-effect transistor;
the selection switch element is configured to be controlled to be turned on and off based on the selection voltage which is input through each of the plurality of selection switch lines to each of the plurality of pixels;
each of the plurality of pixels in the second region includes:
a lighting switch element connected between the second electrode of the field-effect transistor and the self light-emitting element;
a second holding capacitor element connected between a signal line of the plurality of signal lines and the gate electrode of the field-effect transistor; and
a reset switch element connected between the gate electrode and a second electrode of the field-effect transistor;
the lighting switch element is configured to be controlled to be turned on and off based on the lighting voltage which is input through each of the plurality of lighting switch lines to each of the plurality of pixels; and
the reset switch element is configured to be controlled to be turned on and off based on the reset voltage which is input through each of the plurality of reset lines to each of the plurality of pixels.

6. The image display device according to claim 1, wherein the self light-emitting element comprises an organic electroluminescence (EL) element.

* * * * *